United States Patent [19]

DiStefano et al.

[11] Patent Number: 4,868,506
[45] Date of Patent: Sep. 19, 1989

[54] DEFECT DETECTION USING INTERMODULATION SIGNALS

[75] Inventors: Thomas H. DiStefano, Bronxville, N.Y.; Arthur E. Falls, Brookfield, Conn.; Arnold Halperin, Peekskill; John D. Mackay, Pound Ridge, both of N.Y.

[73] Assignee: International Business Machines Corporation, Armonk, N.Y.

[21] Appl. No.: 279,482

[22] Filed: Dec. 2, 1988

[51] Int. Cl.$^4$ .................... G01R 31/00; G01R 31/08
[52] U.S. Cl. .................................. 324/521; 324/543; 324/527; 324/537; 379/26
[58] Field of Search ............... 324/543, 512, 520, 521, 324/527, 509, 534, 537; 379/22, 24, 26

[56] References Cited

U.S. PATENT DOCUMENTS

| | | | |
|---|---|---|---|
| 2,929,989 | 3/1960 | Hurvitz | 324/57 |
| 3,369,176 | 2/1968 | Palatinus | 324/57 |
| 3,411,080 | 11/1968 | Palatinus | 324/57 |
| 3,711,769 | 1/1973 | Peake | 324/57 |
| 3,890,570 | 6/1975 | Kristensen et al. | 324/77 |
| 3,927,281 | 12/1975 | Bradley | 179/175.3 R |
| 4,139,815 | 2/1979 | Mueller | 324/57 |
| 4,273,970 | 6/1981 | Favin et al. | 179/175.3 R |
| 4,404,514 | 9/1983 | Reichert, Jr. | 324/52 |
| 4,496,900 | 1/1985 | DiStefano et al. | 324/51 |

Primary Examiner—Reinhard J. Eisenzopf
Assistant Examiner—Anthony L. Miele
Attorney, Agent, or Firm—Philip J. Feig

[57] ABSTRACT

In order to test conductors on substrates for current constricting defects, such as cracks, narrow conductors, line breaks and intermittent opens, a test signal combining two alternating current signals at different frequencies and direct current offset signal is applied to the conductor. Upon encountering a defect, intermodulation signals are generated and detected. The phase of the detected signal and the phase of a reference signal are compared. The difference between the phase of the two signals is indicative of the presence of a defect in the conductor. The invention has particular application for testing thin conductors.

20 Claims, 5 Drawing Sheets

DEFECT DETECTION USING INTERMODULATION SIGNALS

BACKGROUND OF THE INVENTION

This invention relates to nondestructive testing of conductors for constrictions and discontinuations, and particularly for testing of thin conductors located on highly thermal conducting substrates.

A significant and increasingly difficult problem with packaging and interconnection systems in complex circuits, such as circuits in computers with high levels of integration, is the detection of incipient opens that escape standard conductivity testing of conductors.

In order to test thin conductors located on highly thermal conducting substrates by means of a non-linear conduction method, a higher operating frequency is required than has been the case heretofore. The higher operating frequency is required because of the much shorter thermal time constants encountered.

As used herein the term thin conductors generally refers to a conductor having physical dimensions less than 1 mil by 1 mil in cross-section disposed on a substrate. The term highly thermal conductive substrate as used herein refers to substrate materials such as ceramics and quartz and other substrates having a thermal conductivity in the range between approximately 0.003 to 0.03 watt/cm °C.

A prior art non-linear detection technique is described in U.S. Pat. No. 4,496,900, assigned to the assignee of the present invention, and incorporated herein by reference. The patent concerns defect detection on glass-epoxy printed circuit boards where the optimum detector operating frequency is one kilohertz. The prior art technique is limited to testing conductors located on substrates which have longer thermal time constants than are encountered with many currently available printed circuit boards or thin film substrates.

In U.S. Pat. No. 4,404,514 there is shown a system for detecting and locating faulty connections in a communication system. A test signal containing the sum of two respective output signals from a pair of oscillators operating at different frequencies in the range between 50 and 400 MHz is transmitted into a cable. A defect in the cable causes a beat frequency signal to be generated along the cable. The time between the transmission of the test signals and receipt of the defect induced signal is indicative of the defect location along the cable.

In the present invention, a test signal containing a direct current offset signal combined with two alternating current signals at different operating frequencies in the range between 10 kilohertz and 20 megahertz is applied to a conductor under test. Upon encountering a defect, intermodulation signals are generated. The phase of the difference frequency intermodulation signal is compared with the phase of a reference signal to indicate the presence of a defect. The mere existence of a signal is not sufficient, rather the phase shift of the signal is indicative of the presence of a defect. Moreover, the frequencies of the two alternating current signal components is important to assure the sensing of defects of the type being sought in the thermal conductivity environment in which the conductors are embedded.

SUMMARY OF THE INVENTION

The present invention provides a method for detecting current constricting defects, such as cracks, narrow conductors, line breaks and intermittent opens, by examining the difference frequency produced by transmitting alternating current (sinusoidal) signals with a direct current offset through a conductor under test.

The present method, as well as the prior art technique, depends upon detection of a non-linear conduction characteristic, caused by ohmic heating in the case of a constriction in the conductor, or by current tunneling in the case of a cracked conductor.

The prior art technique operates by detecting a second harmonic distortion voltage produced when a one kilohertz drive current is applied to a defective conductor. The operating frequency of one kilohertz is suitable for lines greater than 1 mil by 1 mil on a glass-epoxy printed circuit board. A higher frequency drive current is required for use when testing thinner conductors on highly thermally conducting substrates such as ceramics. The prior art technique is impractical at the higher frequencies because the distortion of presently available oscillators increases as a function of frequency above one kilohertz.

The present method relies upon using a higher operating frequency. For example, a 500 kHz drive signal is required for defect detection when testing 7 um×20 um copper conductors on a ceramic/thin film substrate.

An alternative method for high frequency non-linear conductivity testing is to apply two sinusoidal drive currents with a direct current offset. When the currents travel through a conductor containing a non-linear conduction element, intermodulation signals are generated which include the sum and difference frequencies of the two original alternating current drive signals. In the preferred embodiment, the difference frequency signal is detected using super heterodyne receiver techniques as the indicator of a latent defect. It is also possible to detect the sum frequency signal as an indicator of a defect in the conductor under test.

A principal object of the present invention is therefore, the provision of a non-destructive apparatus and method for detecting defects in a conductor by examining the intermodulation signal generated by passing alternating current signals together with a direct current signal through the conductor.

Another object of the invention is the provision of a non-destructive apparatus and method for detecting current constricting defects in thin conductors located on highly thermal conducting substrates.

A further object of the invention is the provision of a non-destructive apparatus and method for detecting defects in a conductor by applying a test signal which is the combination of two sinusoidal drive signals and a direct current signal to the conductor under test and detecting the intermodulation difference frequency signal as an indication of a defect.

Further and still other objects of the present invention will become more clearly apparent when the following description is read in conjunction with the accompanying drawings.

DETAILED DESCRIPTION

Figure 1:
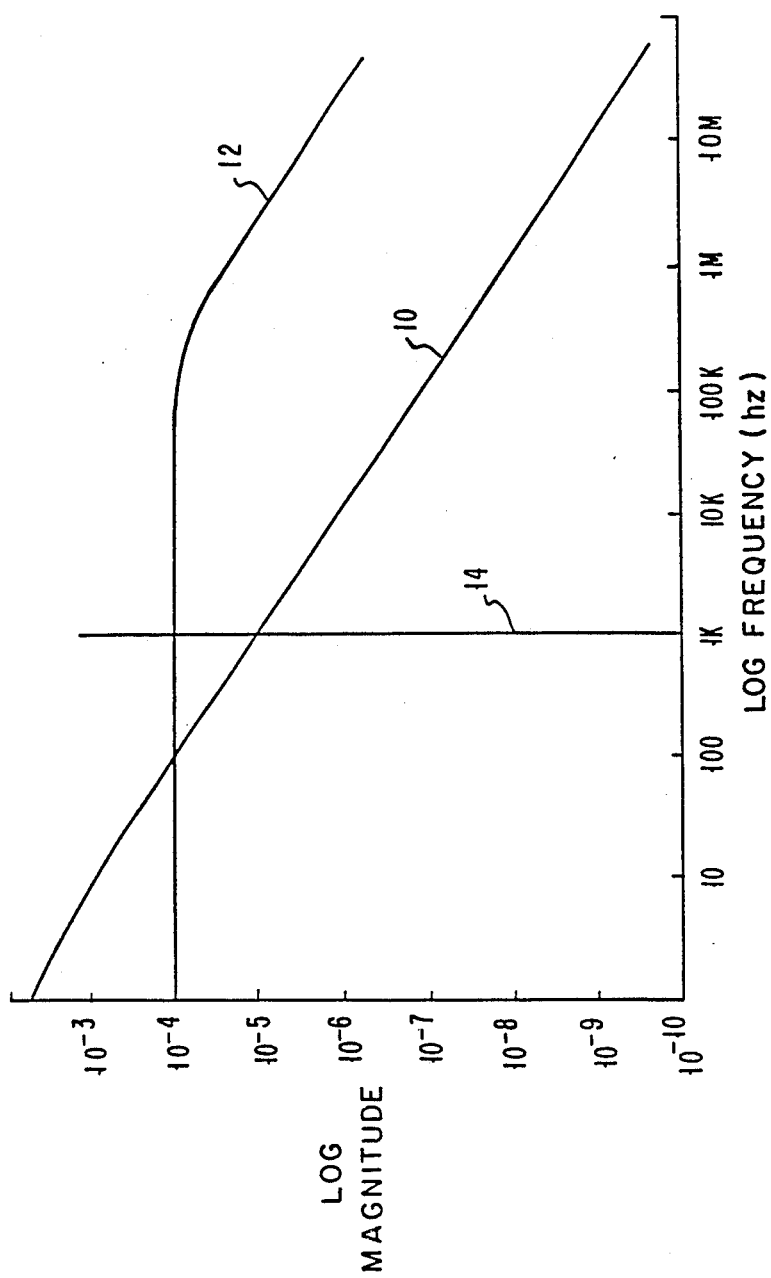
FIG. 1 is a graphical representation of the amplitude versus frequency response of a prior art detector for testing conductors on a glass-epoxy printed circuit board.
Figure 2:
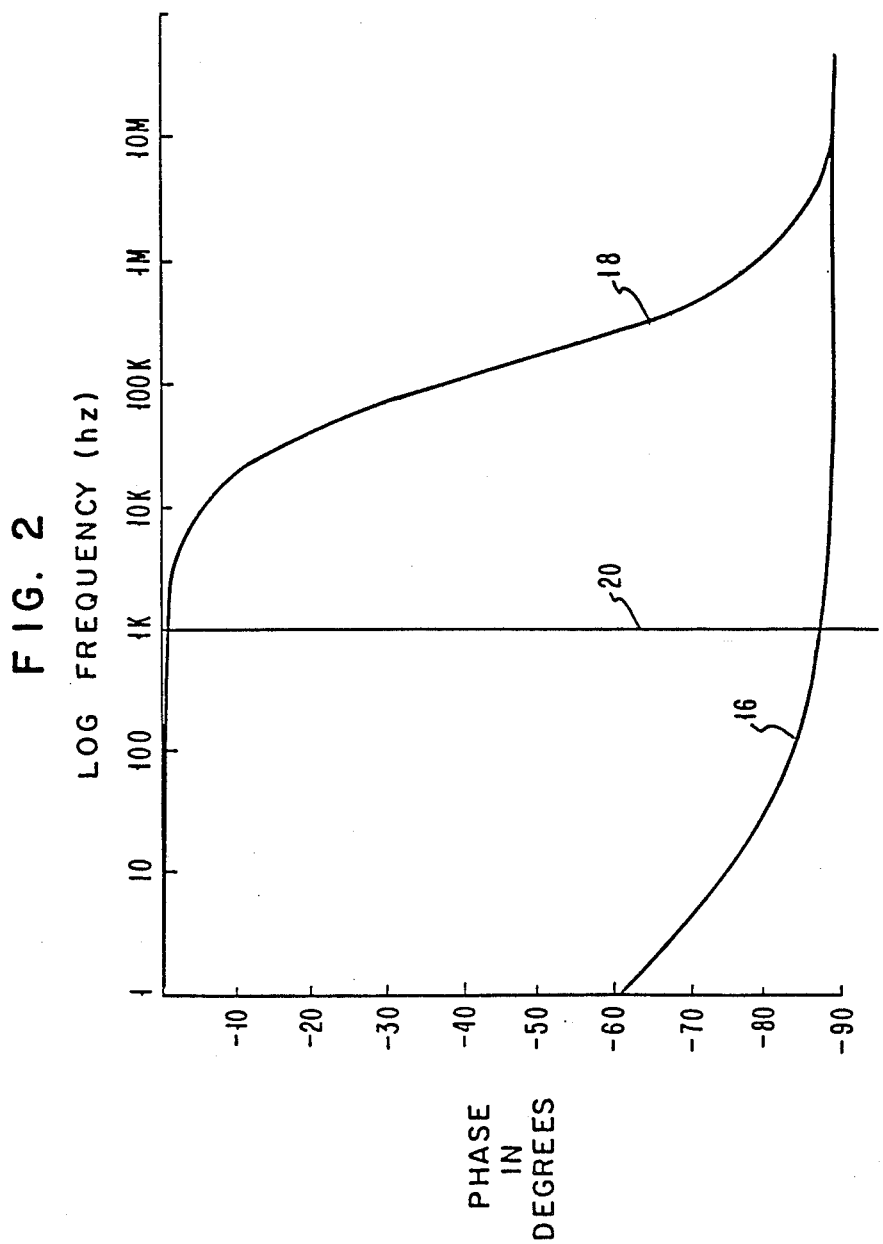
FIG. 2 is a graphical representation of the phase versus frequency response of a prior art detector for testing conductors on a glass-epoxy printed circuit board.

Referring now to the figures and to FIGS. 1 and 2 in particular, there are shown graphical representations of the amplitude versus frequency and phase versus frequency signals generated during test using a prior art detector operating in accordance with the teachings of U.S. Pat. No. 4,496,900 for detecting defects in conductors disposed on glass-epoxy printed circuit boards. Trace 10 represents the amplitude versus detector operating frequency response generated when testing a good or non-defective conductor. Trace 12 represents the amplitude versus detector operating frequency response generated when testing a defective conductor. The solid line 14 intersects traces 10 and 12 at the detector 1 kilohertz operating frequency of the prior art detector.

In FIG. 2, trace 16 represents the phase versus detector operating frequency signals generated when testing a good or non-defective conductor and trace 18 represents the phase versus detector operating frequency signals generated when testing a defective conductor using the prior art method.

For use in testing a conductor, the detector may be calibrated for maximum detection of a detector phase to be selected from a range centered slightly above 0° out of phase with the alternating current component of the test signal so as to maximize discrimination between the 0° phase of the defect second harmonic signals and the near 90° phase of the good or non-defective conductor signal. As seen in FIG. 2, the solid line 20 drawn at a one kilohertz operating frequency optimizes the phase discrimination signal when testing conductors on lower thermal conductivity substrates such as glass-epoxy printed circuit boards.

Figure 3:
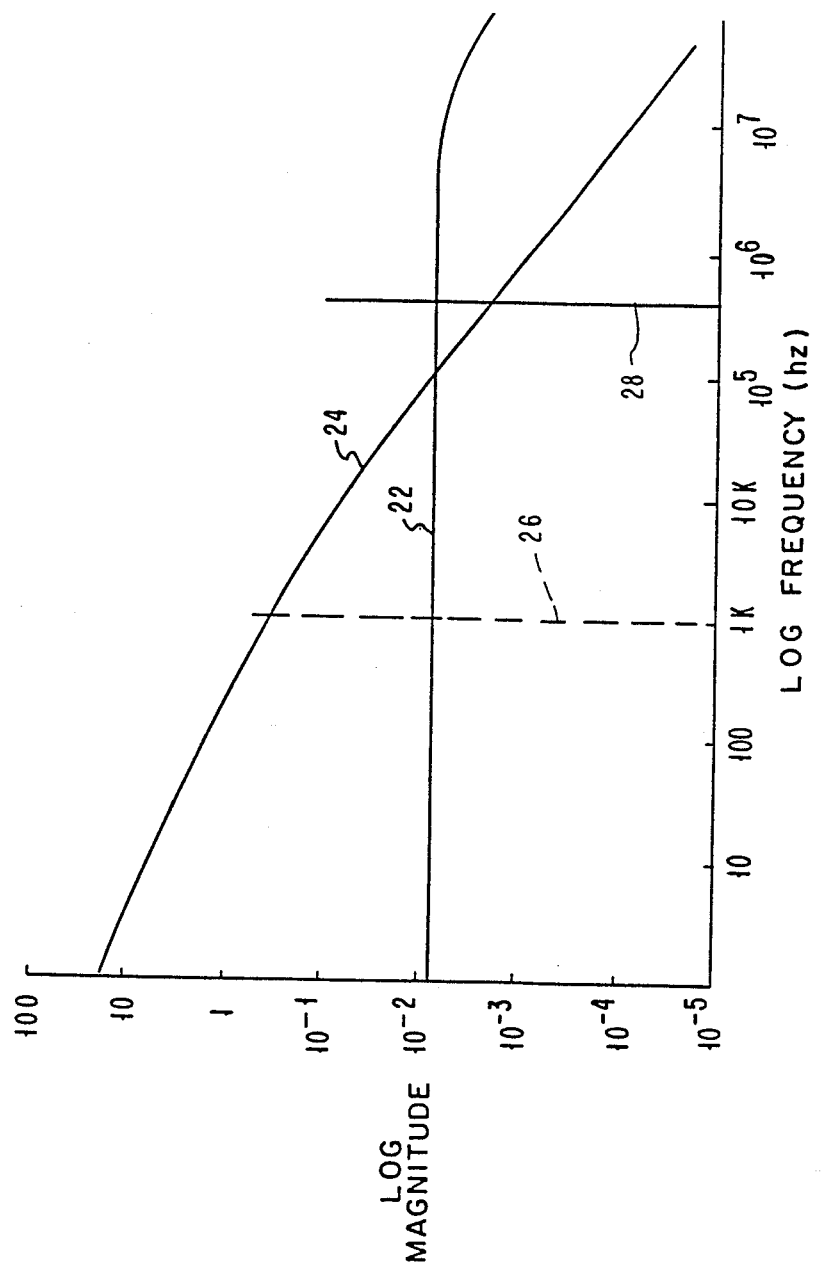
FIG. 3 is a graphical representation of the amplitude versus frequency response for testing conductors on a ceramic substrate.

When testing thin conductors on highly thermal conducting substrates such as ceramic, the preferred operating frequency is much greater. As shown graphically in FIG. 3, where trace 22 represents results of testing a defective conductor, the amplitude versus operating frequency characteristics remain substantially flat until approximately 10 MHz for a typical defect which is about 0.1 mil long. Trace 24, graphically represents the amplitude versus frequency signals generated by a good or non-defective conductor. The dashed line 26 corresponds to an operating frequency of one kilohertz and the solid line 28 corresponds to an operating frequency of 500 kHz.

Figure 4:
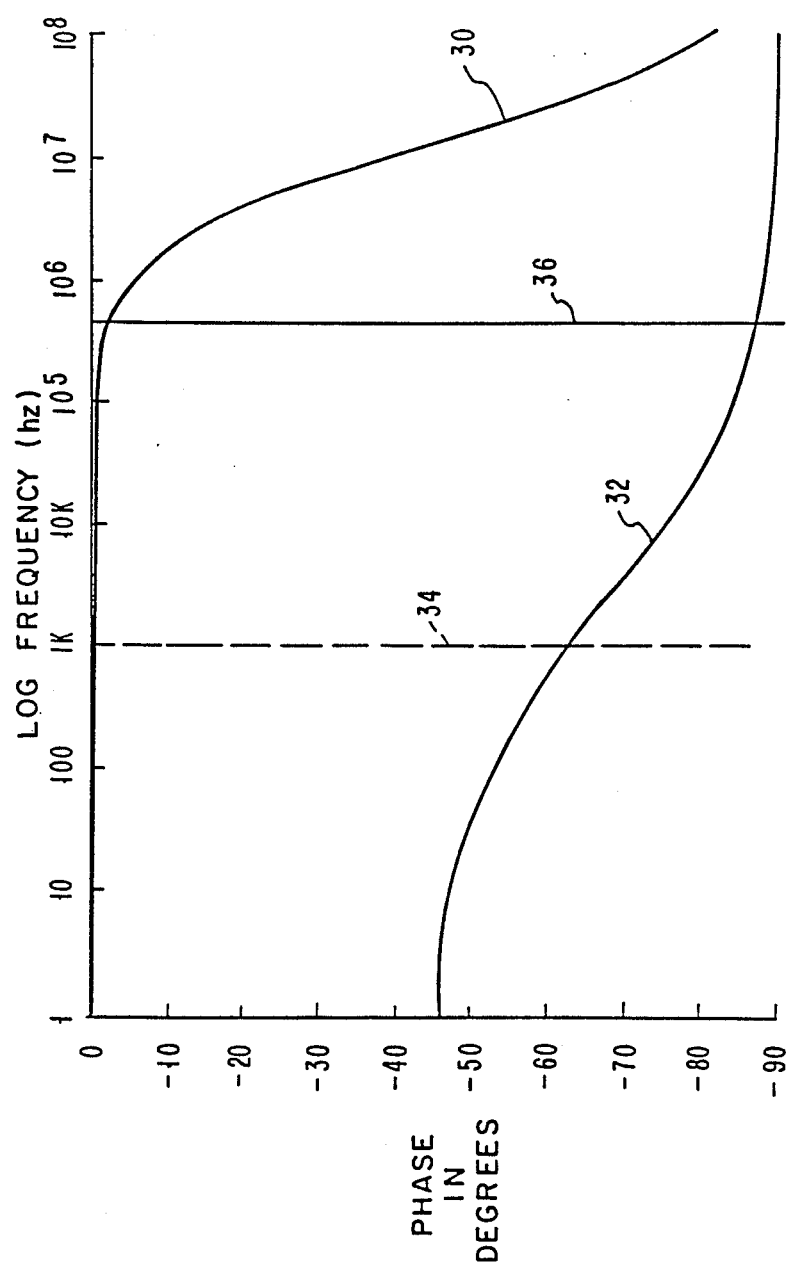
FIG. 4 is a graphical representation of the phase versus frequency response for testing conductors on a ceramic substrate.

When referring to FIG. 4, trace 30 shows the phase versus operating frequency response generated by a defective conductor while trace 32 shows the phase versus operating frequency response generated by a good or non-defective conductor.

In order to maximize phase discrimination between a substantially 0° phase of a defective conductor generated signal and a substantially 90° phase of a good conductor generated signal, an operating detection frequency of approximately 500 khz (indicated by the solid line 36) is preferred. It will be noted that at one kilohertz (indicated by dashed line 34) the phase difference is only approximately 60°. It should also be noted that the signal from a good or non-defective conductor is much smaller at the higher frequency which makes the phase discrimination easier.

It should be apparent to those skilled in the art that while the prior art detector provides results when testing thin conductors on high thermal conducting substrates, i.e. substrates having relatively short thermal time constants, superior results are achieved when a detector employs a higher operating frequency of approximately 500 kHz. However, the prior art detector is impractical at these higher operating frequencies because the distortion of presently available oscillators becomes a significant factor. The present invention overcomes these limitations. A preferred embodiment of an apparatus for practicing the invention is shown schematically in FIG. 5.

In accordance with the present invention, a test signal which is the sum of two sinusoidal drive signals together with a direct current signal is applied to the conductor being tested. Each drive signal is at a different operating frequency in the range between 10 kHz and 20 MHz. When the test signal passes through a non-linear conduction element, e.g. crack, narrow conductor, line breaks, intermittent open, and the like, intermodulation signals are generated which include signals at a frequency which is at the sum of and the difference of the frequencies of the two sinusoidal drive signals. Preferably, the difference frequency is detected using super heterodyne receiver techniques as the indicator of a latent defect. The direct current component of the test signal is necessary for generating difference frequency intermodulation signals from the defect. In the absence of the direct current component, only third-order intermodulation products are produced with an absence of a difference frequency signal. The direct current component of the test signal is prevented from flowing through the detection system, particularly the signal filters, to avoid unwanted generation of another difference frequency signal which would interfere with the actual defect signal. Moreover, detector components such as amplifiers inherently possess square law (second-order) transfer characteristics and therefore, will produce sum and difference frequency signals when both sinusoidal (alternating current) drive signals flow through the amplifiers, even without a direct current offset signal. This undesirable effect is minimized by filtering the detected signal at the alternating current drive signal frequencies before any amplification of the signals is performed.

A drive signal generator 40 includes a direct current offset signal source 42, a parallel connected series combination of a first oscillator 44 providing an alternating current sinusoidal signal at a first operating frequency, $f_1$, in the range between 10 kHz and 20 MHz, a power amplifier 46 for amplifying the alternating current signal from oscillator 44, and a bandpass filter 48 for providing a first alternating current (sinusoidal) drive signal and a parallel connected series combination of a second oscillator 50 providing an alternating current sinusoidal signal at a second operating frequency, $f_2$, in the range between 10 kHz and 20 MHz, a power amplifier 52 for amplifying the alternating current signal from oscillator 50, and a bandpass filter 54 for providing a second alternating current drive signal.

The direct current signal along conductor 56, the first alternating current signal along conductor 58 and the second alternating current signal along conductor 60 are summed and transmitted to a conductor under test 62. The generator 40 is connected to the conductor under test 62 for applying the test signal to the conductor.

A defect manifest along the conductor under test causes intermodulation signals to be generated which signals appear as a voltage signal on the conductor. The operating frequencies and the direct current signals are eliminated by a reject filter 64. The output signal from reject filter 64 is provided to the input of a matching network 66. The output of the matching network 66 is provided to a linear amplifier 68.

The matching network 66 acts in a manner similar to a tuned transformer, matching the input impedance of the linear amplifier 68 to the output impedance of the reject filter 64 at the difference frequency ($f_2-f_1$). It will be apparent that the detection can be accomplished using the higher sum ($f_1+f_2$) frequency signals.

The linear amplifier 68 provides a low distortion gain of the signal from matching network 66 and matches the impedance of the matching network 66 to the intermediate frequency amplifier 70. The intermediate frequency (IF) amplifier 70 further amplifiers the IF signal from linear amplifier 68 and reduces any signal component at the operating frequencies $f_1$ and $f_2$.

The first alternating current drive signal from filter 48 and the second alternating current drive signal from filter 54 are provided as inputs to a mixer circuit 72. The mixer generates a reference signal at the IF frequency ($f_2-f_1$) which is amplified in an IF amplifier 74. The IF frequency in the preferred embodiment is the difference frequency $f_2-f_1$. The output signal from amplifier 74 is provided to a phase shifter 76 where the phase of the input signal is shifted to correspond to the phase of a defect signal. The output signal from phase shifter 76 is provided to amplifier 78 for increasing the magnitude of the phase shifted signal.

A phase detector 80 receives at one input the phase shifted amplified signal from amplifier 78 as a reference signal and at another input the conductor under test generated signal from amplifier 70. The phase detector 80 detects the phase difference between the two signals and provides a direct current voltage output signal proportional to the phase difference between the signal processed reference signal from amplifier 78 and the signal processed detected signal from amplifier 70. The direct current voltage output signal from phase detector 80 is provided to a logarithmic amplifier 82. The logarithmic amplifier 82 provides a first output signal which is displayed at an indicator such as meter 84 and a second output signal which is provided to a go/no-go threshold detector 86 which provides a defect signal when a signal from logarithmic amplifier 82 exceeds a predetermined threshold, indicating the presence of a defect in the conductor under test. The threshold detector 86 is connected to a defect indicator, such as a light, bell, recorder or the like, for providing an indication of a defect being present in the conductor under test.

Figure 5:
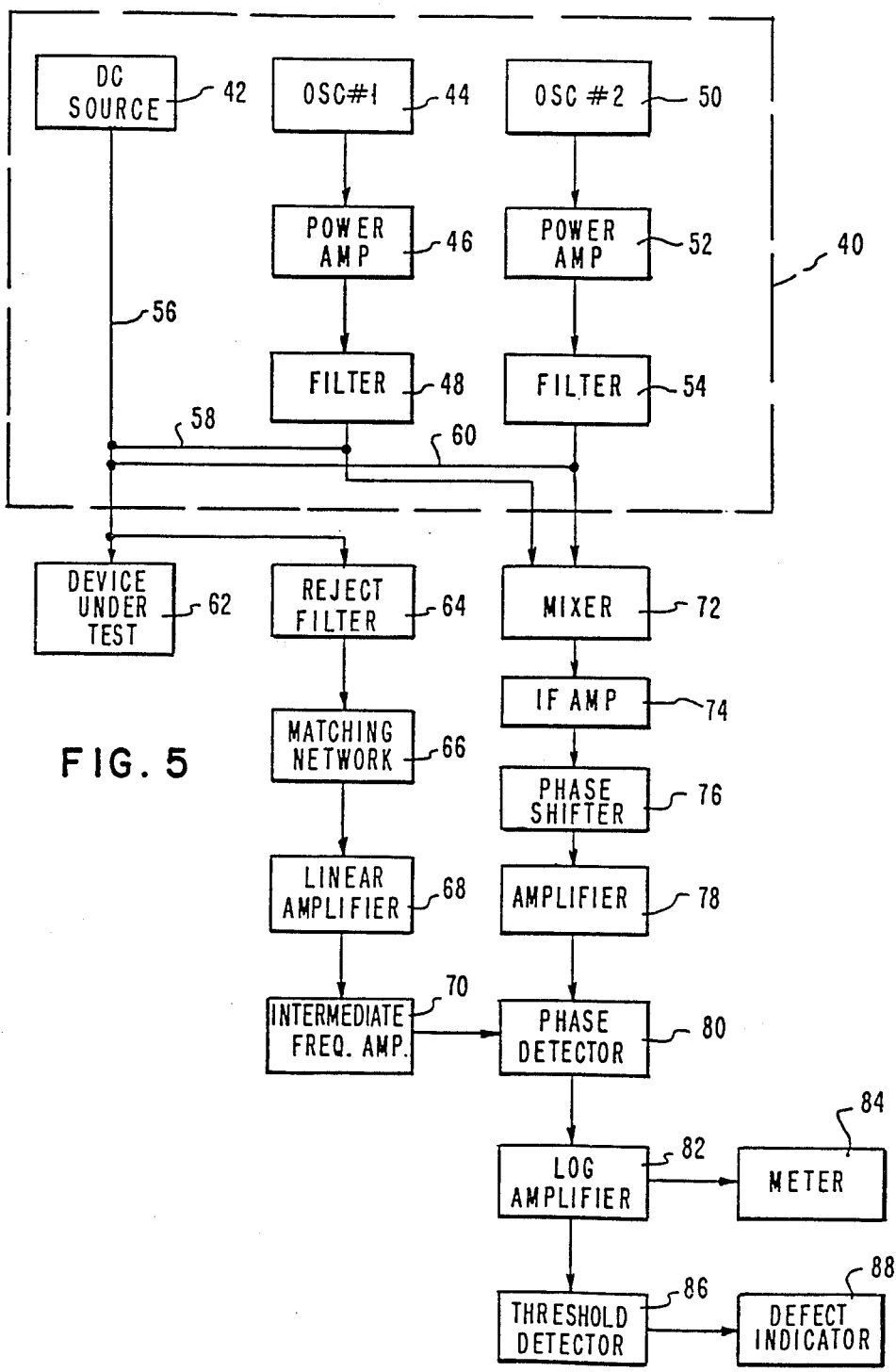
FIG. 5 is a schematic block diagram of a preferred embodiment of the present invention.

The various elements shown in FIG. 5 are generally commercially available.

The test method comprises: applying a test signal comprising two alternating current signals each at a different operating frequency and a direct current signal to a conductor under test. Detecting an intermodulation signal resulting from a defect in the conductor. Processing the detected signal in order to obtain a difference frequency signal, i.e. a signal at a frequency equal to the difference of the frequency of each alternating current signal. A reference signal is also generated at the frequency equal to the difference of the frequencies of the two alternating current signals. The phase difference between the processed difference frequency detected signal and the reference signal is indicative of the presence or absence of a defect in the conductor under test.

While there has been described and illustrated a method and apparatus for non-destructive testing of conductors on substrates using intermodulation signals, modifications and variations will be apparent to those skilled in the art without deviating from the broad principles of the present invention which shall be limited solely by the scope of the appended claims.

What is claimed is:

1. A test apparatus for determining the presence of physical defects in a conductor under test comprising:
    test signal generator means for applying to the conductor under test a test signal as a combination of two alternating current drive signals and a direct current signal, each alternating current drive signal being at a different operating frequency;
    means for coupling said test signal to the conductor under test and for receiving signals generated from the conductor under test, including intermodulation signals indicative of a defect being present in the conductor, and
    phase sensitive detection means coupled to said means for coupling for receiving said signals generated from the conductor for determining the presence of a defect in the conductor.

2. A test apparatus for determining the presence of physical defects in a conductor under test as set forth in claim 1, wherein said phase sensitive detection means includes means for providing a defect signal at a frequency substantially equal to the difference of the operating frequencies of said two alternating current drive signals.

3. A test apparatus for determining the presence of physical defects in a conductor under test as set forth in claim 2, further comprising reference signal generating means for providing a reference signal at a frequency substantially equal to the difference of the operating frequencies of said two alternating current drive signals and phase detector means for comparing the relative phase difference between said defect signal and said reference signal, and providing a comparison signal responsive thereto.

4. A test apparatus for determining the presence of physical defects in a conductor under test as set forth in claim 3, further comprising evaluation means for receiving said comparison signal and providing a signal indicative of the presence and absence of a defect in the conductor under test.

5. A test apparatus for determining the presence of physical defects in a conductor under test as set forth in claim 1, wherein said phase sensitive detection means includes means for providing a defect signal at a frequency substantially equal to the sum of the operating frequencies of said two alternating current drive signals.

6. A test apparatus for determining the presence of physical defects in a conductor under test as set forth in claim 5, further comprising reference signal generating means for providing a reference signal at a frequency substantially equal to the sum of the operating frequencies of said two alternating current drive signals and phase detector means for comparing the relative phase difference between said defect signal and said reference signal, and providing a comparison signal responsive thereto.

7. A test apparatus for determining the presence of physical defects in a conductor under test as set forth in claim 6, further comprising evaluation means for receiving said comparison signal and providing a signal indicative of the presence and absence of a defect in the conductor under test.

8. A test apparatus for determining the presence of physical defects in a conductor under test as set forth in claim 1, wherein both of said different operating frequencies are in the range between 10 kilohertz and 20 megahertz.

9. A method for determining the presence of physical defects in a conductor under test comprising the steps of:
applying to a conductor under test a test signal as a combination of two alternating current drive signals and a direct current signal, each alternating current drive signal being at a different operating frequency;
receiving from the conductor under test an intermodulation signal indicative of a defect being present in the conductor, and
determining the presence of a defect in the conductor responsive to said intermodulation signal.

10. A method for determining the presence of physical defects in a conductor under test as set forth in claim 9, wherein said determining the presence of a defect includes providing a defect signal at a frequency substantially equal to the difference of the operating frequencies of said two alternating current drive signals.

11. A method for determining the presence of physical defects in a conductor under test as set forth in claim 10, further comprising providing a reference signal at a frequency substantially equal to the difference of the operating frequencies of said two alternating current drive signals and comparing the relative phase difference between said defect signal and said reference signal and providing a comparison signal responsive thereto.

12. A method for determining the presence of physical defects in a conductor under test as set forth in claim 11, further comprising evaluating said comparison signal and providing a signal indicative of the presence or absence of a defect in the conductor under test.

13. A method for determining the presence of physical defects in a conductor under test as set forth in claim 9, wherein said determining the presence of a defect includes providing a defect signal at a frequency substantially equal to the sum of the operating frequencies of said two alternating current drive signals.

14. A method for determining the presence of physical defects in a conductor under test as set forth in claim 13, further comprising providing a reference signal at a frequency substantially equal to the sum of the operating frequencies of said two alternating current drive signals and comparing the relative phase difference between said defect signal and said reference signal and providing a comprison signal responsive thereto.

15. A method for determining the presence of physical defects in a conductor under test as set forth in claim 14, further comprising evaluating said comparison signal and providing a signal indicative of the presence or absence of a defect in the conductor under test.

16. A method for determining the presence of physical defects in a conductor under test as set forth in claim 9, wherein both of said different operating frequencies are in the range between 10 kilohertz and 20 megahertz.

17. An apparatus for determining the presence of physical defects in a conductor under test comprising:
test signal generator means including first oscillator means for providing a first alternating current signal at a first operating frequency, second oscillator means for providing a second alternating current signal at a second operating frequency, said first operating frequency and said second operating frequency being different, and direct current signal generating means for providing a direct current signal, for applying to the conductor under test a test signal commensurate with a combination of said first alternating current signal, said second alternating current signal and said direct current signal;
phase sensitive detection means for receiving signals generated from the conductor under test, including intermodulation signals indicative of a non-linear defect being present in the conductor;
filter and amplifier means coupled to said phase sensitive detection means for isolating and amplifying intermodulation signals at a predetermined frequency;
reference signal generating means coupled to said first oscillator means and to said second oscillator means for providing an amplified reference signal at said predetermined frequency;
phase detection means coupled to said filter and amplifier means and to said reference signal generating means for comparing the relative phase shift between said amplified intermodulation signals at said predetermined frequency and said amplified reference signal and providing a comparison signal responsive thereto, and
evaluation means coupled to said phase detection means for evaluating said comparison signal and providing a signal indicative of the presence and absence of defects in the conductor under test.

18. An apparatus for determining the presence of physical defects in a conductor under test as set forth in claim 17, wherein said predetermined frequency is a frequency substantially equal to the difference between said first operating frequency and said second operating frequency.

19. An apparatus for determining the presence of physical defects in a conductor under test as set forth in claim 17, wherein said predetermined frequency is a frequency substantially equal to the sum between said first operating frequency and said second operating frequency.

20. An apparatus for determining the presence of physical defects in a conductor under test as set forth in claim 17, wherein both said first operating frequency and said second operating frequency are in the range between 10 kilohertz and 20 megahertz.

* * * * *